US011217433B2

(12) United States Patent
Mitchell et al.

(10) Patent No.: US 11,217,433 B2
(45) Date of Patent: Jan. 4, 2022

(54) ROTARY UNION WITH MECHANICAL SEAL ASSEMBLY

(71) Applicant: APPLIED Materials, Inc., Santa Clara, CA (US)

(72) Inventors: Robert J. Mitchell, Winchester, MA (US); Guillermo Colom, Salisbury, MA (US)

(73) Assignee: APPLIED Materials, Inc., Santa Clara, CA (US)

( * ) Notice: Subject to any disclaimer, the term of this patent is extended or adjusted under 35 U.S.C. 154(b) by 372 days.

(21) Appl. No.: 16/152,928

(22) Filed: Oct. 5, 2018

(65) Prior Publication Data

US 2020/0111686 A1    Apr. 9, 2020

(51) Int. Cl.
*H01J 37/32*    (2006.01)
*H01L 21/67*    (2006.01)
*H01L 21/687*    (2006.01)

(52) U.S. Cl.
CPC .. *H01J 37/32724* (2013.01); *H01L 21/67109* (2013.01); *H01L 21/68785* (2013.01); *H01L 21/68792* (2013.01)

(58) Field of Classification Search
CPC ............. C23C 16/4409; C23C 16/4411; C23C 16/458; C23C 16/4583; C23C 16/4584; C23C 16/4585; C23C 16/4586; H01L 21/68714; H01L 21/68785; H01L 21/68792; H01J 37/32513; H01J 37/32522; H01J 37/32715; H01J 37/32724
See application file for complete search history.

(56) References Cited

U.S. PATENT DOCUMENTS

| | | | |
|---|---|---|---|
| 4,744,569 A | 5/1988 | Wentworth, Jr. et al. | |
| 5,011,166 A | 4/1991 | Watts | |
| 6,372,048 B1 * | 4/2002 | Futamura | C23C 16/4586 118/724 |

(Continued)

FOREIGN PATENT DOCUMENTS

| | | | |
|---|---|---|---|
| JP | 2006179629 A | * | 7/2006 |
| KR | 20170014775 A | * | 2/2017 |

(Continued)

OTHER PUBLICATIONS

International Search Report and Written Opinion dated Jan. 3, 2020 for PCT/US2019/051643 filed Sep. 18, 2010.

*Primary Examiner* — Benjamin Kendall
*Assistant Examiner* — Kurt Sweely
(74) *Attorney, Agent, or Firm* — Kacvinsky Daisak Bluni PLLC

(57) ABSTRACT

Disclosed is a rotary union including an inner shaft, wherein the inner shaft is rotatable and includes an internal channel operable to deliver a cryogenic fluid to a platen. The rotary union may further include a rotary union shaft surrounding the inner shaft, and a seal assembly coupled to the rotary union shaft. The seal assembly may include a support, a metal bellows extending around an exterior of the support, and a seal support coupled to the metal bellows, wherein the seal support extends around the support. The seal assembly may further include a non-rotating seal component seated in the seal support, and a rotating seal component in abutment with the non-rotating seal component to create a mechanical seal therebetween.

17 Claims, 4 Drawing Sheets

(56) References Cited

U.S. PATENT DOCUMENTS

| | | | |
|---|---|---|---|
| 6,689,221 B2 * | 2/2004 | Ryding | C23C 14/505 |
| | | | 118/724 |
| 10,704,693 B2 * | 7/2020 | Mitchell | F16L 27/0828 |
| 2003/0073309 A1 | 4/2003 | Emami | |
| 2003/0230854 A1 | 12/2003 | Kim | |
| 2009/0159566 A1 * | 6/2009 | Brillhart | C23C 14/505 |
| | | | 216/58 |
| 2009/0314207 A1 * | 12/2009 | Endoh | C01B 33/035 |
| | | | 118/723 R |
| 2012/0108080 A1 * | 5/2012 | Akao | H01L 21/3105 |
| | | | 438/795 |
| 2013/0113169 A1 * | 5/2013 | Sugi | H01L 21/68792 |
| | | | 279/128 |
| 2014/0263275 A1 * | 9/2014 | Nguyen | H01L 21/67248 |
| | | | 219/446.1 |
| 2017/0219144 A1 * | 8/2017 | Petrou | F16L 27/087 |

FOREIGN PATENT DOCUMENTS

| | | | | |
|---|---|---|---|---|
| WO | 2017221631 A1 | 12/2017 | | |
| WO | WO-2017221631 A1 * | 12/2017 | | H01J 37/32715 |

\* cited by examiner

US 11,217,433 B2

ROTARY UNION WITH MECHANICAL SEAL ASSEMBLY

FIELD

The present embodiments relate to rotary unions for delivery of cryogenic fluids, and more particularly, to rotary unions including a mechanical seal assembly.

BACKGROUND

In some workpiece processing systems, a workpiece is disposed on a rotatable platen. The platen may also include electrical components, such as electrodes in communication with a power source. Additionally, the platen may have fluid conduits to allow a fluid to pass therethrough to heat or cool the platen. These fluid conduits are in communication with an external fluid source and an external fluid sink. Because the platen rotates, a rotary union may be used to link the platen to the external components. The rotary union provides the electrical connections, as well as fluid inlets and fluid outlets. In some cases, the electrical connections may be integrated, while in others, a separate electrical rotary union may be employed. Further, typically, one end of the rotary union is disposed in a process chamber often maintained at very low pressure, while the other side is disposed at atmospheric conditions. The workpiece may be a semiconductor wafer subjected to one or more processes while disposed on the platen. These processes may include etching, deposition, and ion implantation.

Processing of semiconductor wafers at cryogenic temperatures has shown improved performance. Frequently wafers are moved in the processing environment. A method for transferring a cryogenic heat transfer medium to a moving workpiece holder is needed. Dynamic mechanical seals are one option used to prevent leakage of the cooling fluid to the process environment. However, cryogenic dynamic mechanical seals are difficult to make reliable, as the seals are prone to leakage due to thermal expansion when the cryogenic heat transfer fluid flows through the rotary union.

Consequently, a rotary union having seals capable of withstanding extremely low temperatures without failing would be beneficial. Such a rotary union would make possible to more effectively perform cryogenic processing of the workpiece using a rotating platen.

SUMMARY

This Summary is provided to introduce a selection of concepts in a simplified form further described below in the Detailed Description. This Summary is not intended to identify key features or essential features of the claimed subject matter, nor is the summary intended as an aid in determining the scope of the claimed subject matter.

In one embodiment, a rotary union includes an inner shaft, wherein the inner shaft is rotatable and includes an internal channel operable to deliver a cryogenic fluid to a platen. The rotary union may further include a rotary union shaft surrounding the inner shaft, and a seal assembly coupled to the rotary union shaft. The seal assembly may include a support, a metal bellows extending around an exterior of the support, and a seal support coupled to the metal bellows, wherein the seal support extends around the support. The seal assembly may further include a non-rotating seal component connected to the seal support, and a rotating seal component in abutment with the non-rotating seal component.

In another embodiment, a workpiece processing system may include a process chamber housing a platen, and a rotary union coupled to the platen. The rotary union may include an inner shaft, wherein the inner shaft is rotatable and includes an internal channel operable to deliver a cryogenic fluid to a platen. The rotary union may further include a rotary union shaft surrounding the inner shaft, and a seal assembly coupled to the rotary union shaft. The seal assembly may further include a support, a metal bellows extending around an exterior of the support, and a seal support coupled to the metal bellows, wherein the seal support extends around the support. The seal assembly may further include a non-rotating seal component seated in the seal support, and a rotating seal component in abutment with the non-rotating seal component.

In yet another embodiment, a rotary union may include an inner shaft, wherein the inner shaft is rotatable and includes an internal channel operable to deliver a cryogenic fluid to a platen. The rotary union may further include a rotary union shaft surrounding the inner shaft, and a seal assembly coupled to the rotary union shaft. The seal assembly may include a support, a metal bellows extending circumferentially around an exterior of the support, and a seal support coupled to the metal bellows, wherein the seal support extends circumferentially around the support. The rotary union may further include a non-rotating seal component seated in the seal support, the non-rotating seal component including a first interface surface, and a rotating seal component directly adjacent the non-rotating seal component. The first interface surface of the non-rotating seal component is maintained in direct physical contact with a second interface surface of the rotating seal component.

Figure 1:
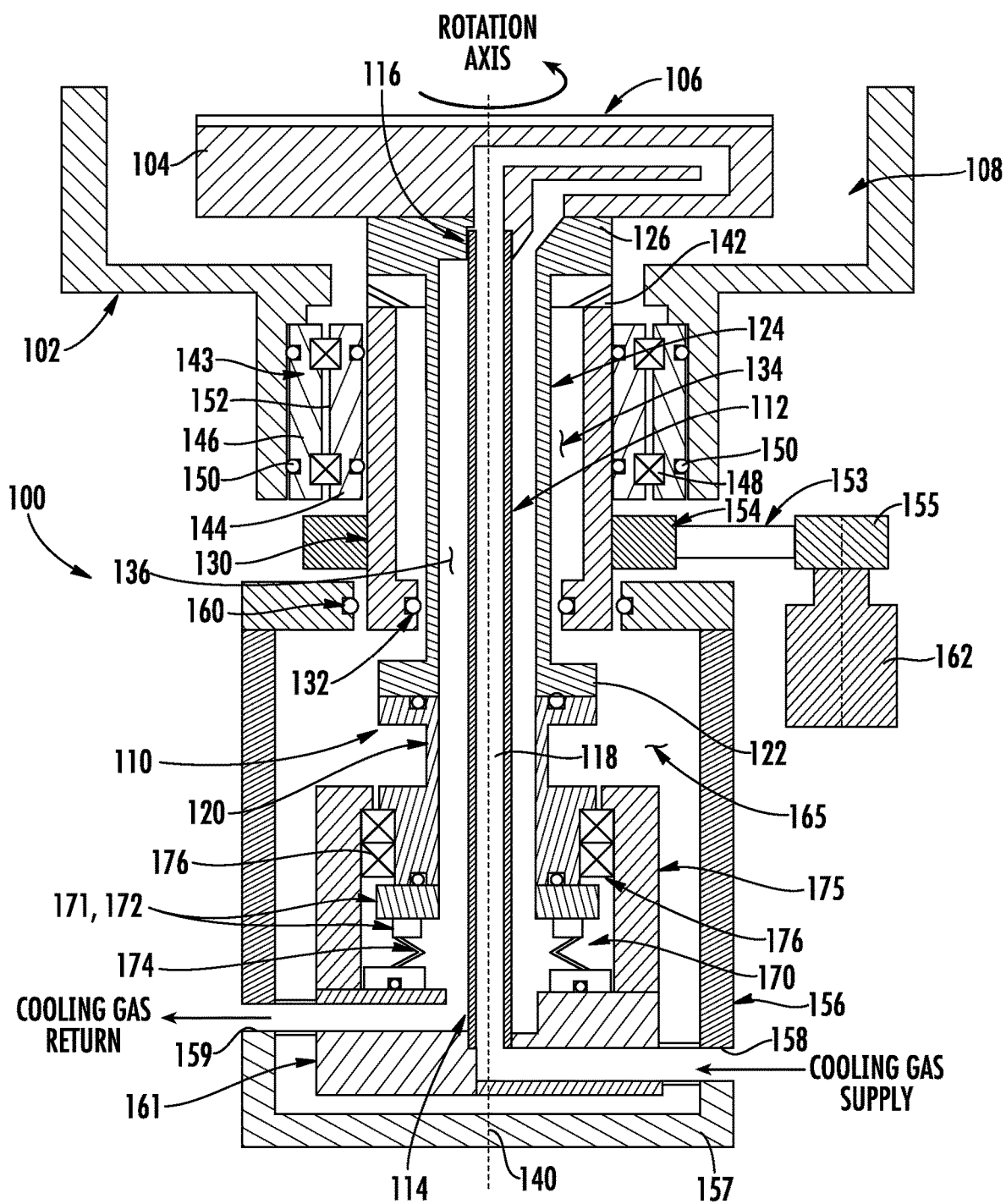
FIG. 1 depicts a side cross-sectional view of workpiece processing system in accordance with an embodiment of the present disclosure.

The drawings are not necessarily to scale. The drawings are merely representations, not intended to portray specific parameters of the disclosure. The drawings are intended to depict exemplary embodiments of the disclosure, and therefore are not to be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines otherwise visible in a "true" cross-sectional view, for illustrative clarity. Furthermore, for clarity, some reference numbers may be omitted in certain drawings.

DETAILED DESCRIPTION

Workpiece processing systems and rotary unions in accordance with the present disclosure will now be described more fully hereinafter with reference to the accompanying drawings, where embodiments of the methods are shown.

The workpiece processing systems and rotary unions may be embodied in many different forms and are not to be construed as being limited to the embodiments set forth herein. Instead, these embodiments are provided so this disclosure will be thorough and complete, and will fully convey the scope of the system and method to those skilled in the art.

As mentioned above, cryogenic mechanical seals are difficult to make reliable. Embodiments of the present disclosure address this deficiency by using a mechanical seal utilizing a hermetically sealed welded metal bellows capable of expanding to assure the mechanical seal remains leak tight during temperature variations. The welded metal bellows may provide a preloaded mechanical seal to isolate a cryogenic fluid from the surrounding environment while allowing rotation of a payload, such as a wafer on a platen.

Specifically, embodiments of the present disclosure include a rotary union including a seal assembly, the seal assembly including a rotating shaft with a hard mechanical wear surface attached to the end of the rotating shaft. Opposite the mechanical wear surface may be another hard mechanical wear surface fixedly attached to the compliant welded metal bellows. The welded metal bellows may be attached to a gas manifold of the rotary union. The gas manifold provides a path for cryogenically cooled fluid to enter and leave the rotary union. Also attached to the gas manifold is a housing supporting a bearing, in turn supporting the rotating shaft and allows for the desired rotary motion. The bearing can be any typical rotary bearing used in rotary motion applications such as ball bearings, plain journal bearings, or similar bearing mechanisms.

The metal welded bellows may provide a force to engage the two halves of the mechanical seal so mating surfaces of the two halves are always maintained in intimate contact. The two halves of the mechanical seal may be machined to be extremely flat so leakage is minimized by the small gaps between the two seal faces. As the parts of the rotary union assembly change temperature, the parts change size due to thermal expansion. Previous designs of seals may expand and contract to such an extent a small gap for preventing leakage becomes larger than intended, resulting in leakage. The embodiments of the present disclosure take advantage of the spring properties of the metal bellows to maintain contact between the mating seal components to ensure any gap between the components is maintained at any temperature. The rotary union is then attached to the rotating payload so the cryogenic fluid can be passed from a fluid chiller to the workpiece holder, thus providing cooling to the workpiece. Although non-limiting, the two opposing seal faces may be manufactured from material(s) having excellent wear resistance and machined extremely flat to minimize gaps. For example, hard materials such as tungsten carbide, silicon carbine, graphite, etc., may be used.

Turning now to FIG. 1, there is shown a workpiece processing system (hereinafter "system") 100 according to various embodiments of the disclosure. As shown, the system 100 includes a process chamber 102 housing a platen 104, the platen 104 operable to support a wafer 106 thereon. The process chamber 102 may include a plurality of walls defining a sealed chamber 108 maintained at vacuum, or near vacuum, conditions. As used herein, "near vacuum conditions" refers to a pressure of less than 50 millitorr. In some embodiments, an ion source (not shown) may also be in communication with the process chamber 102. In other embodiments, one or more components may be disposed between the ion source and the process chamber 102. The type of processing defines the configuration. In one particular non-limiting embodiment, the process is a physical vapor deposition (PVD), wherein gases may be introduced into the process chamber 102 to form a film on the wafer 106. In another embodiment, the wafer 106 may be subjected to an ion implantation where either a beamline system or a plasma source is in communication with the process chamber 102. For example, a beam-line ion implantation system 100 may have a mass analyzer, one or more acceleration/deceleration stages, and a collimator disposed between the ion source and the process chamber 102. In yet another embodiment, the wafer 106 may be subject to an etch process. In an etch process, a source of RF energy may be placed above the wafer 106 and the platen may be electrically biased. Thus, the location of the ion or plasma source relative to the process chamber 102 is not limited by this disclosure.

As shown, the system 100 may further include a rotary union 110 coupled to the platen 104. The rotary union 110 may include an inner shaft 112 having a first end 114 opposite a second end 116, wherein the second end 116 is coupled to the platen 104. In exemplary embodiments, the inner shaft 112 is rotatable and includes an internal channel 118 operable to deliver a cryogenic fluid to the platen 104. The system may further include a rotary union shaft 120 surrounding the inner shaft 112, wherein the rotary union shaft 120 is directly coupled to a first end 122 of an intermediate tube 124. The intermediate tube 124 surrounds the inner shaft 112, and includes a second end 126 fixedly coupled to the platen 104. As such, the intermediate tube 124 and the platen 104 may rotate together. In some embodiments, the rotary union shaft 120 and the intermediate tube 124 may be a unitary component.

The system may further include an outer shaft 130 surrounding the intermediate tube 124. The outer shaft 130 may form a static seal 132 with an exterior of the intermediate tube 124 to isolate the process chamber environment from the rotary union environment. A channel 134 may separate the outer shaft 130 from the intermediate tube 124. A return channel 136 may separate the intermediate tube 124 and the inner shaft 112, wherein the return channel 136 is operable to deliver a cryogenic fluid from the system 100 after passing through the platen 104. The inner shaft 112, the intermediate tube 124 and the outer shaft 130 may be referred to as a rotating shaft assembly, as all three of the components rotate about an axis 140. In some embodiments, the inner shaft 112, the intermediate tube 124 and the outer shaft 130 may be concentrically arranged. Furthermore, in non-limiting embodiments, the inner shaft 112, the intermediate tube 124, and the outer shaft 130 may each be stainless steel.

An outer shaft support 142 may be disposed between the outer shaft 130 and the intermediate tube 124 near the upper end of the outer shaft 130. The outer shaft support 142 may mechanically support the outer shaft 130 and help maintain the channel 134. Further, the outer shaft support 142 may be thermally insulating to minimize the transfer of heat between the intermediate tube 124 and the outer shaft 130. Additionally, the outer shaft support 142 may have openings so the channel 134 is part of the atmosphere of the process chamber 102. In this way, the channel 134 may also be maintained at near vacuum conditions.

The process chamber 102 may also include a rotary ferrofluid seal 143 isolating the process chamber 102 from the atmosphere. In non-limiting embodiments, the rotary ferrofluid seal 143 includes an inner shaft 144 and an outer shaft 146 joined together by one or more bearings 148. The inner shaft 144 is secured against an outer surface of the outer shaft 130, and a pair of static seals 150 (e.g., O-rings) serve to decrease potential leaks between the process chamber 102 and the atmosphere. A ferrofluid 152 in the rotary ferrofluid seal 143 is disposed between the bearings 148. Although non-limiting, the ferrofluid 152 and bearings 148 may operate at temperatures greater than about −40° C. The cryogenic fluid may be maintained at temperatures as low as −170° C.

In non-limiting embodiments, the inner shaft 112, the intermediate tube 124 and the outer shaft 130 may be rotated using any suitable means. For example, the rotating shaft assembly may be moved by connection to a drive timing belt 153 and a driven pulley 154 in communication with a motor pulley 155 and motor 162. In other embodiments, the rotating shaft assembly may be directly driven.

The rotary union 110 terminates in an isolation box 156 including a housing 157 having an inlet 158 for supplying a cooling gas, such as a cryogenic fluid, and an outlet 159 for returning the cooling gas. The internal channel 118 of the inner shaft 112 is in fluid communication with the inlet 158, while the return channel 136 is in fluid communication with the outlet 159. The isolation box 156 surrounds the rotary union shaft 120, and includes a dynamic rotary seal 160 to isolate a vacuum isolation environment 165 within the isolation box 156 from the atmospheric pressure outside the isolation box 156. The dynamic rotary seal 160 may be a spring-loaded Teflon seal, O-rings, or any other suitable sealing means. In some embodiments, the isolation box 156 may be kept at sub-atmospheric pressures, such as in the millitorr range. Although non-limiting, the pressure within the isolation box 156 may be 50 millitorr or less. The interior of the isolation box 156 may be continually pumped to sustain the vacuum levels low enough to minimize heat transfer using a vacuum pump (not shown). The isolation box 156 may further include a manifold 161 providing a path for cryogenically cooled fluid to enter and leave the rotary union 110.

The rotary union 110 may further include a seal assembly 170 coupled to the rotary union shaft. As will be described in greater detail, the seal assembly 170 may include a mechanical seal interface made up of a non-rotating seal component 171 in complementary abutment with a rotating seal component 172. In exemplary embodiments, the rotating seal component 172 is fixed to the rotary union shaft 120 and rotates about the axis 140. The non-rotating seal component 171 may be stationary.

The seal assembly 170 may further include a metal bellows 174 extending from the non-rotating seal component 171. The metal bellows 174 may be a mechanical bellows configured to supply a spring force axially, for example, in a direction parallel to the axis 140, so as to provide a force against the non-rotating seal component 171. Due to the force from the metal bellows 174, the rotating and non-rotating seal components 171, 172 maintain a fluid seal therebetween. In non-limiting embodiments, the metal bellows 174 may be constructed of stainless steel, such as a thin stainless-steel web. The stainless-steel web may be between approximately 0.005 and 0.020 inches, and may be operable to limit thermal conduction yet still function as a hermetic gas barrier. Surrounding the seal assembly 170 may be a rotary union bearing housing 175 and bearings 176.

Figure 2:
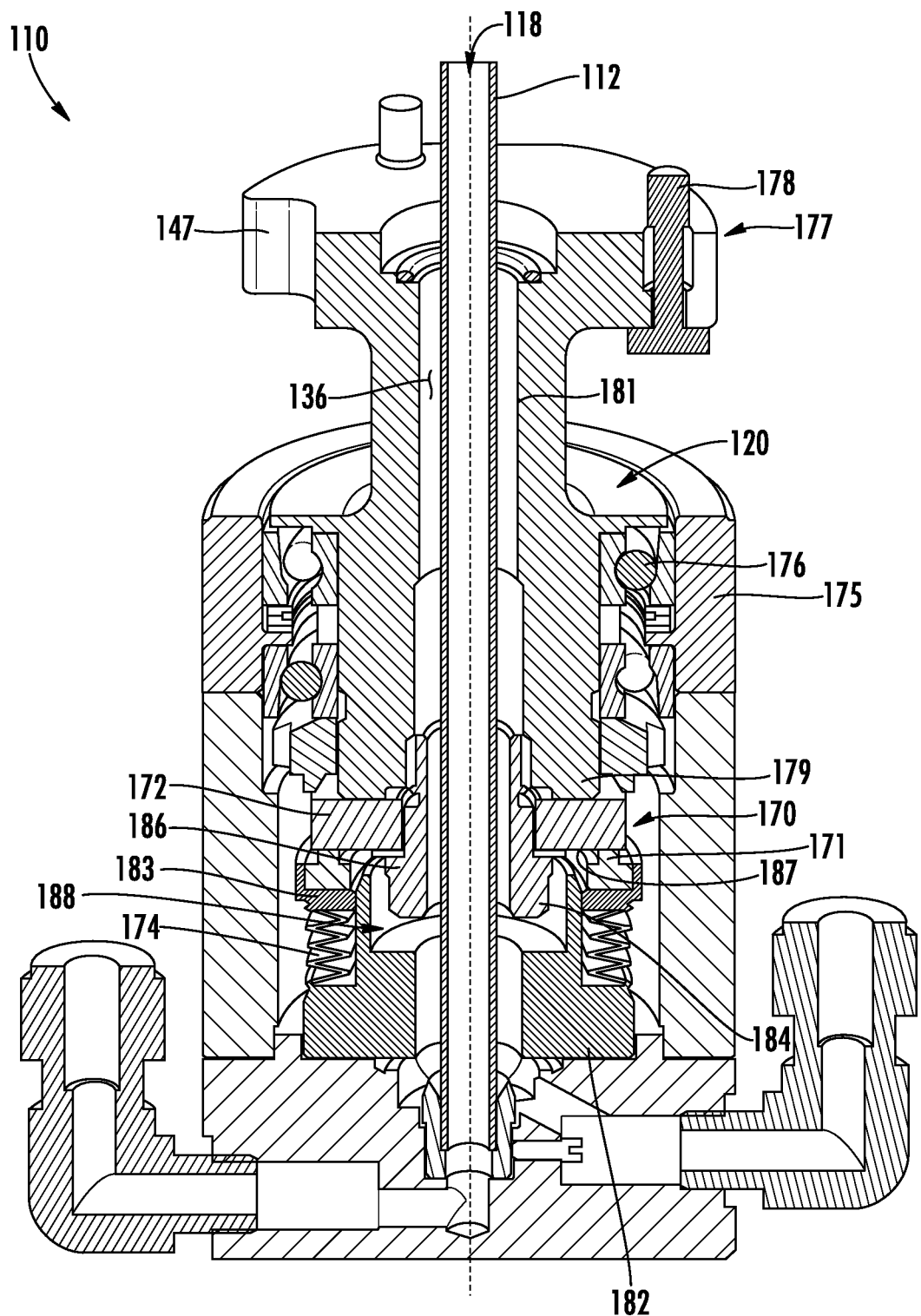
FIG. 2 depicts a perspective cross-sectional view of a rotary union of the workpiece processing system of FIG. 1 in accordance with an embodiment of the present disclosure.

Turning now to FIG. 2, a cross section of the rotary union 110 according to embodiments of the present disclosure will be described in greater detail. As shown, the rotary union may include the inner shaft 112, wherein the inner shaft 112 is rotatable and includes the internal channel 118 operable to deliver a cryogenic fluid to a platen. The rotary union shaft 120 circumferentially surrounds the inner shaft 112, and includes a first end 177 couplable with the intermediate tube 124 (FIG. 1). In non-limiting embodiments, the first end 177 may include a flange 147 having one or more fasteners 178 extending therethrough to secure the rotary union shaft 120 to the intermediate tube 124. The rotary union shaft 120 may further include a second end 179 extending to the rotating seal component 172 of the seal assembly 170. As shown, the inner shaft 112 is disposed within the return channel 136 defined by an inner channel wall 181 of the rotary union shaft 120. The rotary union bearing housing 175 and bearings 176 surrounding the seal assembly 170 and the rotary union shaft 120. As shown, the bearings 176 are disposed between the rotary union bearing housing 175 and an exterior of the rotary union shaft 120.

As shown, the seal assembly 170 may include a support 182 surrounding the inner shaft 112. The support 182 may be positioned below (in the orientation shown) the rotary union shaft 120. The seal assembly includes the metal bellows 174 extending circumferentially and radially along an exterior of the support 182. A seal support 183 may be coupled to the metal bellows 174, wherein the seal support 183 extends circumferentially around the support 182. In some embodiments, the seal support 183 may be a ring free to move up and down along the exterior of the support 182. The seal assembly 170 may further include the non-rotating seal component 171 seated in the seal support 183. The rotating seal component 172 is in direct contact with the non-rotating seal component 171 to form a fluid-tight interface therebetween.

As further shown, the rotary union 110 may include an insert 184 disposed within the return channel 136 and surrounding the inner shaft 112. The insert 184 may extend along the inner channel wall 181 of the rotary union shaft 120. In some embodiments, the rotating seal component 172 surrounds a portion of the insert 184, wherein a flange 186 of the insert engages a bottom surface 187 of the rotating seal component 172. In some embodiments, the insert 184 may be a hollow shaft bolt coupling the rotating seal component 172 to the rotary union shaft 120. Although non-limiting, the insert 184 may extend partially into an internal cavity 188 of the support 182.

Figure 3:
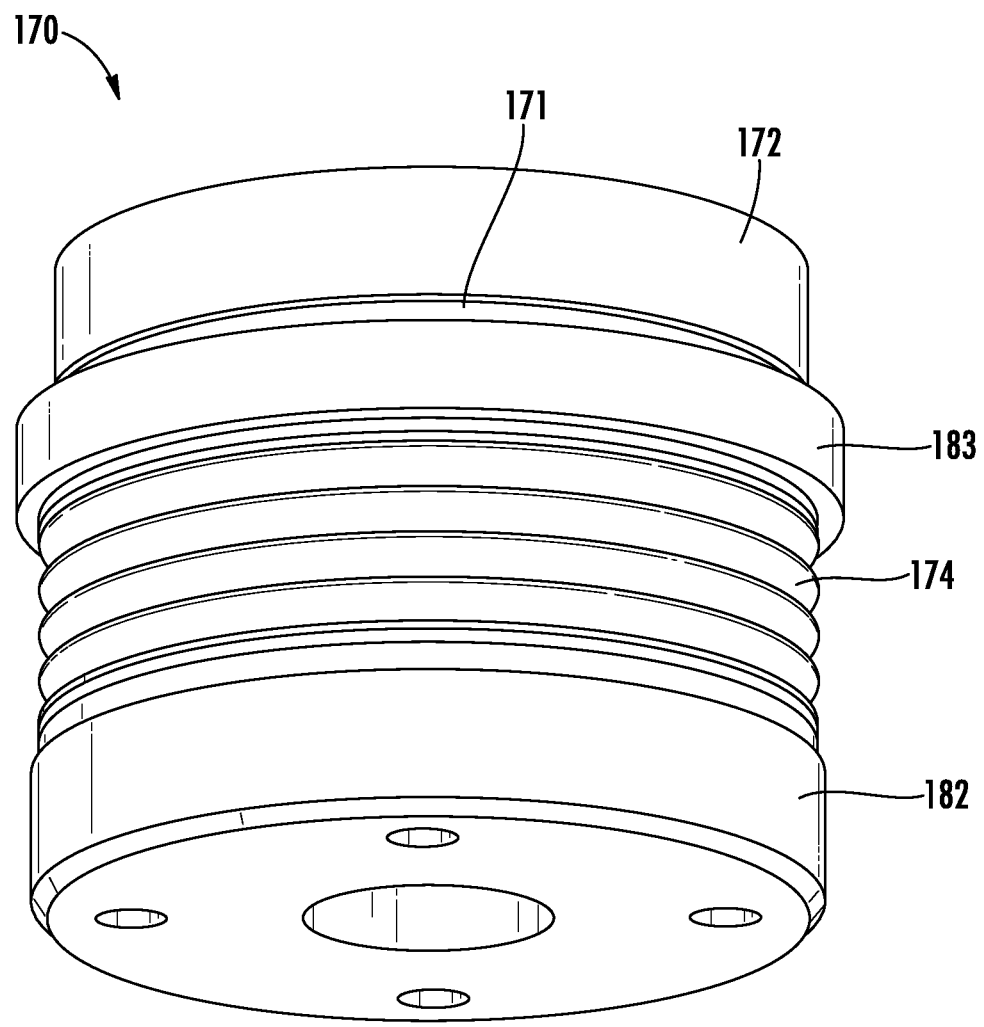
FIG. 3 depicts a perspective view of a seal assembly of the workpiece processing system of FIG. 1 in accordance with an embodiment of the present disclosure.
Figure 4:
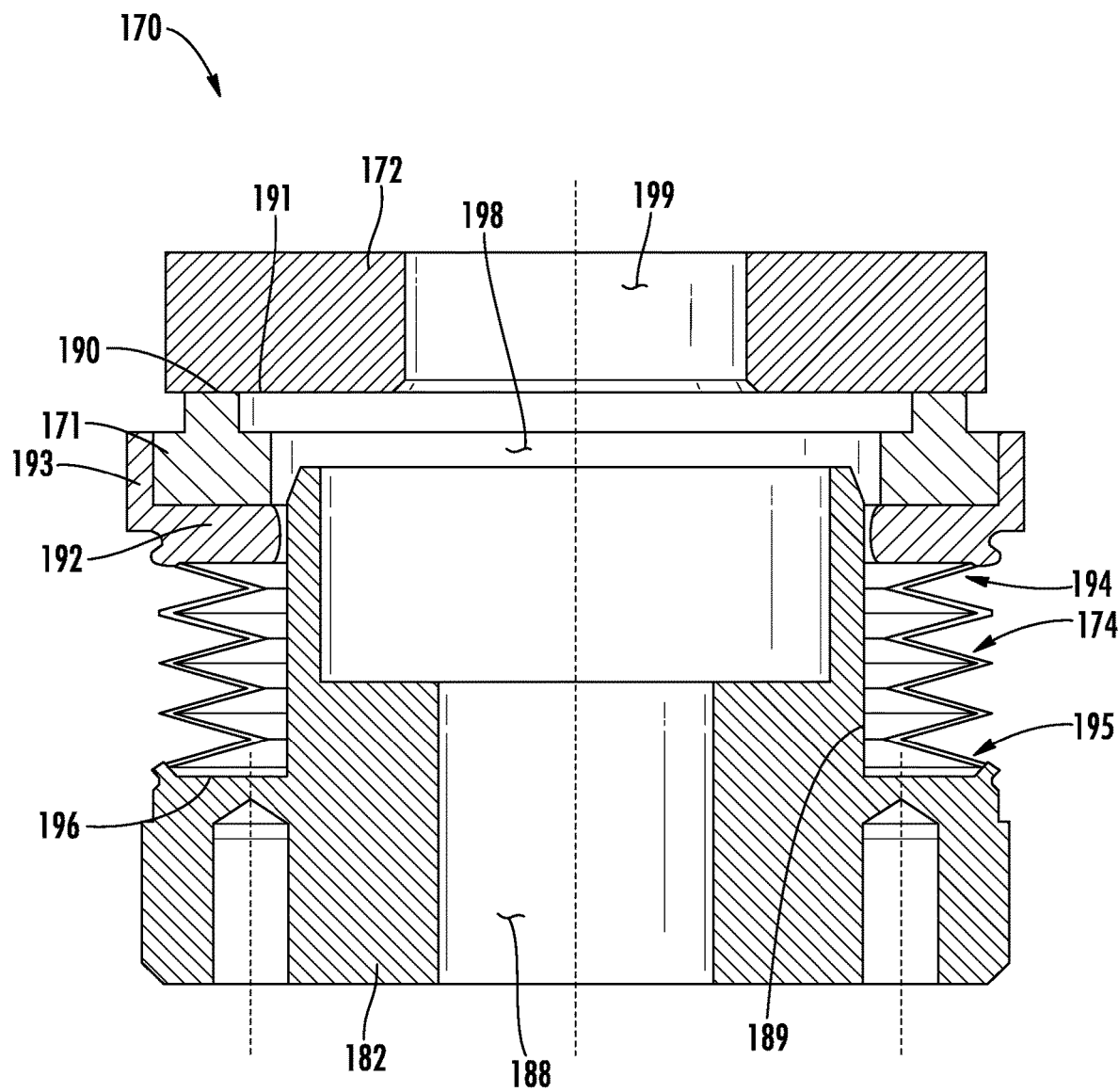
FIG. 4 depicts a perspective cross-sectional view of the seal assembly of FIG. 3 in accordance with an embodiment of the present disclosure.

Turning now to FIGS. 3-4, the seal assembly 170 according to embodiments of the present disclosure will be described in greater detail. As shown, the seal assembly 170 may include the support 182 and the metal bellows 174 extending circumferentially around an outer surface 189 of the support 182. The metal bellows 174 may include a series of connected peaks and valleys configured to collapse and expand with respect to one another as the seal support 183 changes position along the outer surface 189 of the support 182. The non-rotating seal component 171 may be seated in the seal support 183, as shown. In some embodiments, the non-rotating seal component 171 includes a first interface surface 190 configured to engage a second interface surface 191 of the rotating seal component 172. In exemplary embodiments, the first interface surface 190 of the non-rotating seal component 171 is maintained in direct mechanical/physical contact with the second interface surface 191 of the rotating seal component 172. Although non-limiting, the two opposing first and second interface surfaces 190, 191 may be manufactured from materials providing excellent wear resistance, machined extremely flat to minimize gaps. For example, hard materials such as tungsten carbide, silicon carbide, graphite, etc., may be used.

As shown, the seal support 183 may extend circumferentially around the support 182 and may include a base 192 extending radially from the outer surface 189 of the support 182. The seal support 183 may further include a sidewall 193 extending from the base 192, for example, at a perpendicular angle. As shown, the non-rotating seal component 171 is positioned between the sidewall 193 of the seal support 183 and the outer surface 189 of the support 182. In exemplary embodiments, a first end 194 of the metal bellows 174 is directly secured to the base 192 of the seal support 183, and a second end 195 of the metal bellows 174 is directly secured to a ledge 196 of the support 182. As further shown, the support 182 includes the internal cavity 188 fluidly connected with an internal cavity 198 of the non-rotating seal component 171 and an internal cavity 199 of the rotating seal component 172 for removing the cryogenic fluid from the rotary union 110.

The foregoing discussion has been presented for purposes of illustration and description and is not intended to limit the disclosure to the form or forms disclosed herein. For example, various features of the disclosure may be grouped together in one or more aspects, embodiments, or configurations for the purpose of streamlining the disclosure. However, it will be understood, various features of the certain aspects, embodiments, or configurations of the disclosure may be combined in alternate aspects, embodiments, or configurations. Moreover, the following claims are hereby incorporated into this Detailed Description by this reference, with each claim standing on its own as a separate embodiment of the present disclosure.

As used herein, an element or step recited in the singular and proceeded with the word "a" or "an" will be understood as not excluding plural elements or steps, unless such exclusion is explicitly recited. Furthermore, references to "one embodiment" of the present disclosure are not intended to be interpreted as excluding the existence of additional embodiments also incorporating the recited features.

The use of "including," "comprising," or "having" and variations thereof herein is meant to encompass the items listed thereafter and equivalents thereof as well as additional items. Accordingly, the terms "including," "comprising," or "having" and variations thereof are open-ended expressions and can be used interchangeably herein.

The phrases "at least one", "one or more", and "and/or", as used herein, are open-ended expressions, both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

All directional references (e.g., proximal, distal, upper, lower, upward, downward, left, right, lateral, longitudinal, front, back, top, bottom, above, below, vertical, horizontal, radial, axial, clockwise, and counterclockwise) are just used for identification purposes to aid the reader's understanding of the present disclosure, and do not create limitations, particularly as to the position, orientation, or use of this disclosure. Connection references (e.g., attached, coupled, connected, and joined) are to be construed broadly and may include intermediate members between a collection of elements and relative movement between elements unless otherwise indicated. As such, connection references do not necessarily infer two elements are directly connected and in fixed relation to each other.

Furthermore, the terms "substantial" or "substantially," as well as the terms "approximate" or "approximately," can be used interchangeably in some embodiments, and can be described using any relative measures acceptable by one of ordinary skill in the art. For example, these terms can serve as a comparison to a reference parameter, to indicate a deviation capable of providing the intended function. Although non-limiting, the deviation from the reference parameter can be, for example, in an amount of less than 1%, less than 3%, less than 5%, less than 10%, less than 15%, less than 20%, and so on.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, the present disclosure has been described herein in the context of a particular implementation in a particular environment for a particular purpose. Those of ordinary skill in the art will recognize the usefulness is not limited thereto and the present disclosure may be beneficially implemented in any number of environments for any number of purposes. Thus, the claims set forth below are to be construed in view of the full breadth and spirit of the present disclosure as described herein.

In view of the foregoing, at least the following advantages are achieved by the embodiments disclosed herein. Firstly, the welded metal bellows of the seal assembly provides a preload force to a mechanical seal so the seal maintains minimal leakage over a wider operating temperature range. Secondly, reducing leakage provides improved efficiency and a small volume for the cryogenic fluid supply system. Providing a rotary union with improved sealing performance due to the metal bellows allows various applications difficult or not previously possible. For example, cryogenic fluid can be supplied to a rotating platen within a process chamber with a minimal amount of leakage of cryogenic fluid.

While certain embodiments of the disclosure have been described herein, the disclosure is not limited thereto, as the disclosure is as broad in scope as the art will allow and the specification may be read likewise. Therefore, the above description is not to be construed as limiting. Instead, the above description is merely as exemplifications of particular embodiments. Those skilled in the art will envision other modifications within the scope and spirit of the claims appended hereto.

What is claimed is:

1. A rotary union comprising:
    an inner shaft, wherein the inner shaft is rotatable about a rotation axis and includes an internal channel operable to deliver a cryogenic fluid to a platen;
    a rotary union shaft surrounding the inner shaft; and
    a seal assembly coupled to the rotary union shaft, the seal assembly comprising:
        a support including a wall having an inner surface and an outer surface, wherein the inner surface defines an internal cavity, and wherein the inner shaft extends through the internal cavity;
        a metal bellows directly coupled to the outer surface of the wall of the support;
        a seal support coupled to the metal bellows, the seal support extending around the support, wherein the seal support comprises:
            a base extending radially from the outer surface of the wall of the support; and
            a sidewall extending from the base;
        a non-rotating seal component connected to the seal support; and
        a rotating seal component in abutment with the non-rotating seal component, wherein the rotating seal component and the non-rotating seal component are stacked vertically with respect to one another along the rotation axis.

2. The rotary union of claim 1, further comprising:
a rotary union bearing housing surrounding the seal assembly and the rotary union shaft; and
at least one bearing disposed between the rotary union bearing housing and the rotary union shaft.

3. The rotary union of claim 1, further comprising an intermediate tube surrounding the inner shaft, wherein a first end of the intermediate tube is coupled to the rotary union shaft, and wherein a second end of the intermediate tube is coupled to the platen.

4. The rotary union of claim 1, wherein the non-rotating seal component is positioned between the sidewall and the outer surface of the support.

5. The rotary union of claim 1, the seal assembly further comprising an insert surrounding the inner shaft, the insert extending along an inner channel wall of the rotary union shaft.

6. The rotary union of claim 5, wherein the rotating seal component surrounds the insert.

7. A workpiece processing system, comprising:
a process chamber housing a platen;
a rotary union coupled to the platen, the rotary union comprising:
an inner shaft, wherein the inner shaft is rotatable about a rotation axis and includes an internal channel operable to deliver a cryogenic fluid to the platen;
a rotary union shaft surrounding the inner shaft; and
a seal assembly coupled to the rotary union shaft, the seal assembly comprising:
a support including a wall having an inner surface and an outer surface, wherein the inner surface defines an internal cavity, and wherein the inner shaft extends through the internal cavity;
a metal bellows directly coupled to the outer surface of the wall of the support;
a seal support coupled to the metal bellows, the seal support extending around the support, wherein the seal support comprises:
a base extending radially from the outer surface of the wall of the support; and
a sidewall extending from the base;
a non-rotating seal component seated in the seal support; and
a rotating seal component in abutment with the non-rotating seal component, wherein the rotating seal component and the non-rotating seal component are stacked vertically with respect to one another along the rotation axis.

8. The workpiece processing system of claim 7, further comprising:
a rotary union bearing housing surrounding the seal assembly and the rotary union shaft; and
at least one bearing disposed between the rotary union bearing housing and the rotary union shaft.

9. The workpiece processing system of claim 7, the rotary union further comprising an intermediate tube surrounding the inner shaft, wherein a first end of the intermediate tube is coupled to the rotary union shaft, and wherein a second end of the intermediate tube is coupled to the platen.

10. The workpiece processing system of claim 7, wherein the non-rotating seal component is positioned between the sidewall of the seal support and the outer surface of the wall of the support.

11. The workpiece processing system of claim 7, the seal assembly further comprising an insert surrounding the inner shaft, the insert extending along an inner channel wall of the rotary union shaft.

12. The workpiece processing system of claim 11, wherein the rotating seal component surrounds the insert.

13. A rotary union comprising:
an inner shaft, u herein the inner shaft is rotatable about a rotation axis and includes an internal channel operable to deliver a cryogenic fluid to a platen;
a rotary union shaft surrounding the inner shaft; and
a seal assembly coupled to the rotary union shaft, the seal assembly comprising:
a support including a wall having an inner surface and an outer surface, wherein the inner surface defines an internal cavity, and wherein the inner shaft extends through the internal cavity;
a metal bellows extending circumferentially around the outer surface of the wall of the support, wherein the metal bellows is directly coupled to the outer surface;
a seal support coupled to the metal bellows, the seal support extending circumferentially around the support, wherein the seal support comprises:
a base extending radially from the outer surface of the wall of the support; and
a sidewall extending from the base;
a non-rotating seal component seated in the seal support, the non-rotating seal component including a first interface surface; and
a rotating seal component directly adjacent the non-rotating seal component, wherein the first interface surface of the non-rotating seal component is maintained in direct physical contact with a second interface surface of the rotating seal component, wherein the rotating seal component and the non-rotating seal component are stacked vertically with respect to one another along the rotation axis.

14. The rotary union of claim 13, further comprising:
a rotary union bearing housing surrounding the seal assembly and the rotary union shaft; and
at least one bearing disposed between the rotary union bearing housing and the rotary union shaft.

15. The rotary union of claim 13, further comprising an intermediate tube surrounding the inner shaft, wherein a first end of the intermediate tube is coupled to the rotary union shaft, and wherein a second end of the intermediate tube is coupled to the platen.

16. The rotary union of claim 13,
wherein the non-rotating seal component is positioned atop the base, between the sidewall of the seal support and the outer surface of the wall of the support.

17. The rotary union of claim 13, the seal assembly further comprising an insert surrounding the inner shaft, wherein the insert extends along an inner channel wall of the rotary union shaft, and wherein the rotating seal component surrounds the insert.

* * * * *